Jan. 1, 1957 J. O. SILVEY ET AL 2,775,896

RADIO FREQUENCY TUNER

Filed Aug. 9, 1952 2 Sheets-Sheet 1

INVENTORS.
JOHN O. SILVEY
HAROLD L. OVERMAN

BY [signature]

ATTORNEY

Jan. 1, 1957 J. O. SILVEY ET AL 2,775,896

RADIO FREQUENCY TUNER

Filed Aug. 9, 1952 2 Sheets-Sheet 2

INVENTORS.
JOHN O. SILVEY
HARALD L. OVERMAN
BY R P Morris
ATTORNEY

United States Patent Office 2,775,896
Patented Jan. 1, 1957

2,775,896

RADIO FREQUENCY TUNER

John O. Silvey and Harold L. Overman, Fort Wayne, Ind., assignors to International Telephone and Telegraph Corporation, a corporation of Maryland Application August 9, 1952, Serial No. 303,458

6 Claims. (Cl. 74—10.85)

This invention relates to radio frequency tuners, and particularly to tuners of the turret body type.

More particularly this invention relates to the mechanical means for tuning the turret type tuner over two separate and distinct frequency spectrums; e. g., the very high (V. H. F.) and ultra high frequency (U. H. F.) spectrums.

In the copending application to J. O. Silvey, Serial No. 303,457, filed August 9, 1952, there is disclosed and described a radio frequency tuner of the turret type, capable of operating over both the V. H. F. and U. H. F. frequency spectrums.

This invention is directed to the mechanical dial means for controlling the tuning of the tuner over both said spectrums.

Accordingly, it is an object of this invention to provide dial indicator means which preferably may be incorporated in the receiver chassis without unduly disturbing the existing relationship of the components parts, and which is both simple and economical to manufacture.

It is a further object of this invention to provide dial means for the tuner, wherein there is maintained a correspondence of the calibration between the V. H. F. and U. H. F. tuning ranges, respectively.

A feature of this invention is the provision of a novel tuning dial for indicating the tuning position of a linear movable tuning element, operating to tune a resonator.

A further feature of this invention is the provision of a novel dial whereby the correspondence of calibration between the V. H. F. and U. H. F. frequencies may be visual.

In accordance with a broad aspect of the invention there is provided a rotatable radio frequency tuner capable of operating over two separate and distinct frequency spectrums. A first means is provided for rotating the tuner through the first of the frequency spectrums, and calibrated to indicate a position for tuning in the second frequency spectrum. When the first means is in the position for tuning in the second frequency spectrum, a second means becomes operative and serves to control the tuning of the tuner over the second frequency spectrum; the second means being operable independently of said first means.

The above-mentioned and other features and objects of this invention and the manner of attaining them will become more apparent and the invention itself will be best understood, by reference to the following description of an embodiment of the invention taken in conjunction with the accompanying drawings, wherein.

Figure 1:
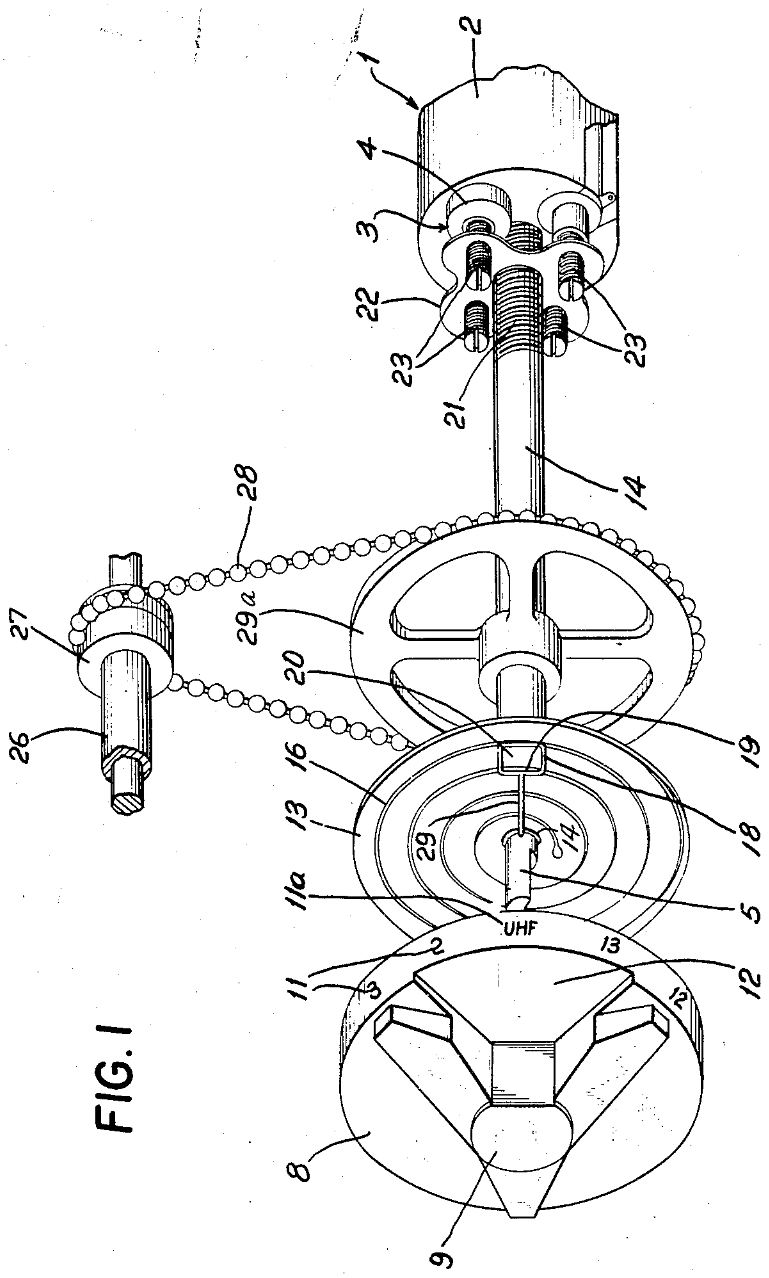
Fig. 1 is an exploded view of a preferred embodiment of the invention.

Referring to Fig. 1, there is shown the U. H. F. tuner section generally indicated at 1 comprising a cylinder 2 having cavity resonators 3 extending therein. The cavity resonator 3 may be tuned by plunger type capacitors 4, the exposed portion of which are shown. The details of the combination V. H. F.—U. H. F. tuner may be found in the above-mentioned copending application, and form no part of this invention.

Figures 3, 4:
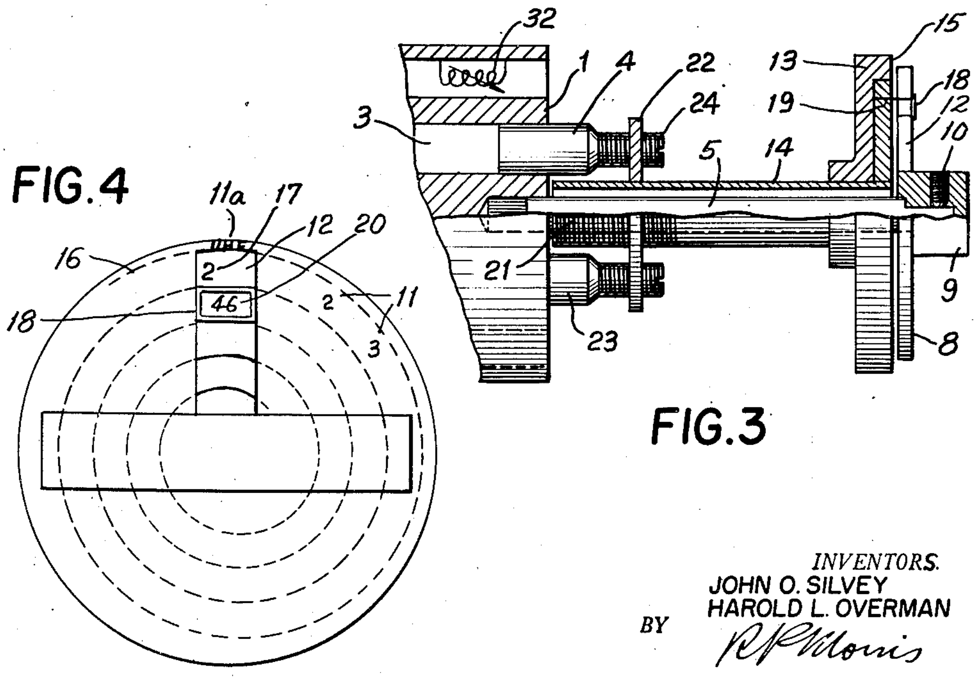
Fig. 3 is a side view shown partly in cross-section of a dialing means forming a second embodiment of the invention.
Fig. 4 is a front view of the dialing means shown in Fig. 3.

Dial means are provided for tuning the tuner over both U. H. F. and V. H. F. spectrums. The dial means comprises a rotatable shaft 5 secured at one end to the turret body (Fig. 3) by any of the well known means, such as a knurl engaging complementary grooves inside the turret body. A first disk member 8 is attached to the opposite end of the shaft 5 by means of a knob 9, which may be integral with or mounted on, the disk 8; the knob 9 may be secured to the shaft 5 by a tight fit or by means such as a set screw 10 (Fig. 3). The disk 8 is calibrated to indicate the V. H. F. frequency channels, shown by way of example at 11 (Figs. 1 and 4). By turning the shaft so that the corresponding calibration is opposite a fixed reference mark, selection of the desired V. H. F. channel is made in the usual way. In addition to the V. H. F. channels there is provided another position **11*a* for U. H. F. tuning. Therefore, the disk 8** may be rotated to select a channel within the V. H. F. frequency spectrum, or a channel within the U. H. F. frequency spectrum.

Figure 2:
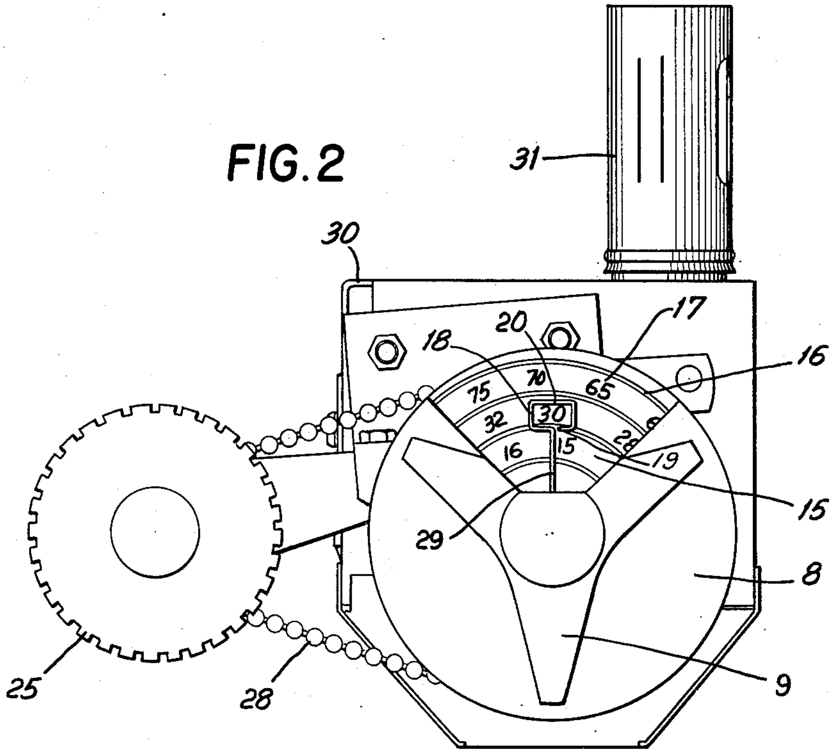
Fig. 2 is a front view of the dialing means shown in Fig. 1.

In disk 8, as best seen in Figs. 1, 2 and 4, there is provided a guide window Figs. 1, 2 or aperture 12 Fig. 4, radially of the disk. A second disk 13 is attached to one end of a sleeve 14 in juxtaposition with the first disk 8. The sleeve 14 is rotatable about the shaft 5 and is preferably concentric therewith. The face 15 of disk 13, juxtaposing the first disk 8 has a spiral cam groove 16 formed therein. The space between successive radial traces of the groove is provided with indicia shown by way of example at 17, Figs. 2 and 4. The indicia 17 represents the U. H. F. frequency channels. In the embodiment of Figs. 1 and 3, a frame shaped window tab 18 is radially mounted on the shaft 5 and comprises a guide 19 which slidably cooperates with one or more traces of the spiral groove 16. This guide may be formed by a depending end 19 of the wire from which frame 18 is formed. A window opening 20 of the tab 18 is dimensioned to overlie the indicia 17. It will be clear that instead of a groove the spiral control means may be in the form of a rib on which a follower rides, to position the window tab 18.

The sleeve 14 is externally threaded at one end 21 and threadedly engages a plate member 22. The rotatable plate 22 is bored and tapped to receive threaded end portions 23 of the capacitive caps 4, whereby initial adjustment of the positions of these caps may be set.

Although in principle the embodiments shown in Figs. 1 and 3 are essentially the same, different means are provided for rotating the U. H. F. indicator disk 13; the preferred means being shown in Figs. 1 and 2. In the embodiment shown in Figs. 1 and 2 the U. H. F. indicator disk is rotated by means of a U. H. F. tuning knob 25 coupled to a sleeve 26 which drives a pulley 27 and drive chain 28 operating on another pulley **29*a* which is secured to the sleeve 14. Also the window is preferably in the form of a sector of a circle as shown in Fig. 2, and the window tab 18 is radially coupled to the shaft 5 by a window tab shaft 29. The shaft 29 is movable in the shaft 5 in only the radial direction. Fig. 2 also shows a tuner housing 30 and an electrical component 31** included in the tuner.

In the second embodiment as shown in Figs. 3 and 4 the U. H. F. indicator disk 13 is preferably of greater diameter than the disk 8 so that one may easily grasp with his fingers the periphery of the disk 13, whereby it may be directly rotated. The window tab 18 in this embodiment is maintained in its radial position by the aperture 12 in the disk 8. Accordingly the aperture is rectangularly shaped and the window tab preferably fits snugly therein so that the lateral displacement of the window tab may be effectively prevented.

Fig. 3, in addition, shows schematically the turret body including a coil 32 shown connected to the V. H. F. section of the tuner.

The desired V. H. F. channel is selected by rotating the knob 9, which causes disk 8, shaft 5, and the turret body to rotate. The rotation of the turret body causes the entire assembly to rotate therewith. It is to be realized that when the tuner is in position to receive a V. H. F. channel the disk 13 may be rotated, but ineffectively because the U. H. F. tuner is not connected into the electrical circuit. When it is desired to select a U. H. F. channel the disk 8 is rotated to the U. H. F. tuning position whereupon the U. H. F. tuner section is connected into the electrical circuit. When the tuner is in this position the disk 13 may be effectively rotated to select a desired channel; in the preferred embodiment by means of a U. H. F. tuning knob, and in the other embodiment, directly by turning the disk 13. The rotation of the disk 13 causes the window tab to move linearly in the aperture 12. Simultaneously with the linear movement of the window tab 18, the sleeve 14 is rotated and imparts a linear movement to the plate 22, thus tuning the cavities 3 by sliding the capacitive caps 4 therein. Therefore, the rotation of disk 13 tunes the U. H. F. section of the tuner and simultaneously indicates the channel to which the U. H. F. tuner is being tuned.

Although the illustration shows a combined U. H. F. and V. H. F. tuner, the linear tuning adjustment and dial indicating features for tuning the resonator, forming the U. H. F. tuner, is considered novel independently of the turret tuner.

While we have described above the principles of our invention in connection with specific apparatus, it is to be clearly understood that this description is made only by way of example and not as a limitation of the scope of our invention as set forth in the objects thereof and in the accompanying claims.

What is claimed is:

1. In a rotatable radio frequency tuner capable of operating over two separate and distinct frequency spectrums, a first dial calibrated to indicate channels lying in the first frequency spectrum, and a position for tuning in a second frequency spectrum, a second dial operative when said first dial is in said position and calibrated to indicate channels lying in the second frequency spectrum, said second dial having a spiral cam groove on a face thereof, the space between successive radial traces of the groove containing said calibrations, a channel indicator radially mounted on said face and comprising a guide slidably cooperating with at least one trace of the spiral groove, whereby rotation of said second dial causes said marker to move radially on said face and indicates the channel to which the tuner is being tuned.

2. The tuner according to claim 1, wherein said first and second dials are in juxtaposition, and the calibrations on the second dial are visible on the face juxtaposing said first dial, said first dial having an aperture therein, through which the calibrations on said second dial are viewable.

3. In a combination very high frequency-ultra high frequency tuner of the turret body type, dial means for tuning said tuner over both said frequency ranges, said dial means comprising a first rotatable shaft mechanically coupled at one end to said turret body, a first rotatable disk fastened to the opposite end of said shaft, and calibrated to indicate the very high frequency channels and a position for ultra high frequency tuning; a rotatable sleeve surrounding said shaft but movable independently thereof, a second disk fastened to one end of said sleeve, and calibrated to indicate the ultra frequency channels, and means coupled to the opposite end of said sleeve and said tuner and operative when said first disk is in the ultra high frequency position, for controlling the tuning thereof.

4. In a combination very high frequency-ultra high frequency tuner of the turret body type, dial means for tuning said tuner over both said frequency ranges, said dial means comprising a first rotatable shaft mechanically coupled at one end to said turret body, a first disk fastened to the opposite end of said shaft, and calibrated to indicate the very high frequency channels and a position for ultra high frequency tuning; a plurality of ultra high frequency resonators, each tuned by a linearly moved tuning element, a plate member mechanically coupled to said resonators, the tuning elements fixed to said plate, a second shaft member threaded into said plate for moving said plate and said tuning element, and a second disk fastened to said second shaft and calibrated to indicate the ultra high frequency channels.

5. In a combination very high frequency-ultra high frequency tuner of the turret body type, dial means for tuning said tuner over both said frequency ranges, said dial means comprising a rotatable shaft mechanically coupled at one end to said turret body, a first disk fastened to the opposite end of said shaft, and calibrated to indicate the very high frequency channels and a position for ultra high frequency tuning, an aperture in said disk; a rotatable sleeve surrounding said shaft and spaced therefrom, a second disk attached to one end of said sleeve and in juxtaposition with said first disk, the face of said second disk juxtaposing said first disk having a spiral cam groove formed therein, the space between successive adjacent traces of the groove containing indicia representing the ultra high frequency channels, a window tab radially mounted in said aperture and having guide means slidably cooperating with at least one trace of the spiral groove, the window portion of said tab overlying the indicia; a plurality of ultra high frequency resonators, each moved by a linearly moved tuning element, a plate member mechanically coupled to said resonators, the tuning elements fixed to said plate; said sleeve having one end threaded into said plate for moving said plate and said tuning element, whereby said window tab will be radially positioned upon rotation of said sleeve.

6. A tuner dial means for indicating and tuning a resonator by a linearly moved tuning element, comprising a plate mechanically coupled to said resonator, the tuning element fixed to said plate, a shaft member threaded into said plate for moving said plate and said tuning element, a disk with a spiral cam surface fixed to said shaft; a cover plate attached to said shaft and overlying said cam surface and provided with a radial guide aperture, and an indicator slidably mounted in said guide aperture and engaging said spiral cam, whereby said indicator will be radially positioned upon rotation of said shaft.

References Cited in the file of this patent

UNITED STATES PATENTS

| | | |
|---|---|---|
| 2,205,103 | Mahnken | June 18, 1940 |
| 2,579,659 | Fisher | Dec. 25, 1951 |